(12) United States Patent
Benedict et al.

(10) Patent No.: US 10,631,405 B1
(45) Date of Patent: Apr. 21, 2020

(54) ADDITIVE MANUFACTURING TECHNOLOGY (AMT) INVERTED PAD INTERFACE

(71) Applicant: RAYTHEON COMPANY, Waltham, MA (US)

(72) Inventors: James E. Benedict, Lowell, MA (US); Timothy David Deley, Warrington, PA (US); Thomas V. Sikina, Acton, MA (US); Michael Ryan Souliotis, Somerville, MA (US); Andrew R. Southworth, Lowell, MA (US); Kevin Wilder, Derry, NH (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 16/576,895

(22) Filed: Sep. 20, 2019

(51) Int. Cl.
| *H05K 1/11* | (2006.01) |
| *H05K 3/40* | (2006.01) |
| *H05K 3/46* | (2006.01) |
| *H05K 3/10* | (2006.01) |
| *H05K 3/00* | (2006.01) |

(52) U.S. Cl.
CPC ............ *H05K 1/113* (2013.01); *H05K 3/10* (2013.01); *H05K 3/4007* (2013.01); *H05K 3/4038* (2013.01); *H05K 3/4644* (2013.01); *H05K 3/0047* (2013.01)

(58) Field of Classification Search
CPC .... H05K 1/113; H05K 3/4007; H05K 3/4038; H05K 3/4644; H05K 3/10; H05K 3/0047
USPC ......................................... 174/257, 262, 263
See application file for complete search history.

(56) References Cited

U.S. PATENT DOCUMENTS

| 5,147,084 A * | 9/1992 | Behun .................... G01R 31/04 174/259 |
| 6,747,217 B1 | 6/2004 | Jochym et al. |
| 2009/0020319 A1 * | 1/2009 | Yamada ............... H05K 3/4617 174/255 |
| 2017/0125375 A1 * | 5/2017 | Chinnusamy ....... H01L 21/4825 |

* cited by examiner

*Primary Examiner* — Sherman Ng
(74) *Attorney, Agent, or Firm* — Lando & Anastasi, LLP

(57) ABSTRACT

A multilayer printed circuit board includes a first dielectric layer and a second dielectric layer, each layer having a top surface and a bottom surface. The first dielectric layer is positioned above the second dielectric layer with the bottom surface of the first dielectric layer facing the top surface of the second dielectric layer. The top surface of the second dielectric layer has a conductive trace. The second dielectric layer has a through-hole that extends through the conductive trace. The multilayer printed circuit board includes an inverted pad interface structure including an inverted pad provided on the bottom surface of the first dielectric layer, a first solder layer provided on a surface of the inverted pad, a second solder layer provided on the conductive trace, and a copper wire positioned within the through-hole to provide the vertical and electrical connection with the conductive trace.

19 Claims, 6 Drawing Sheets

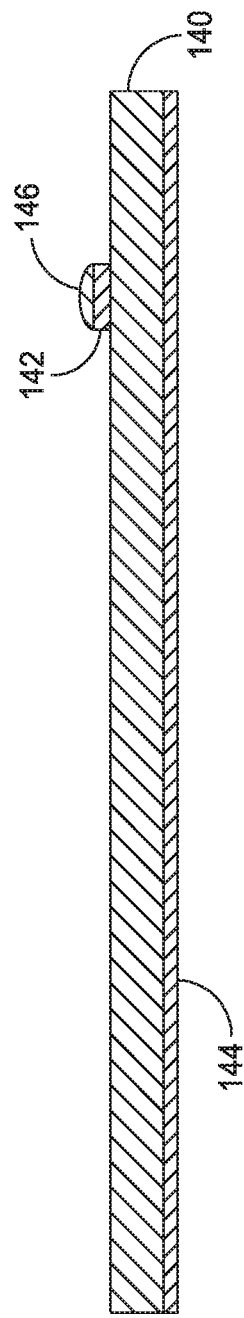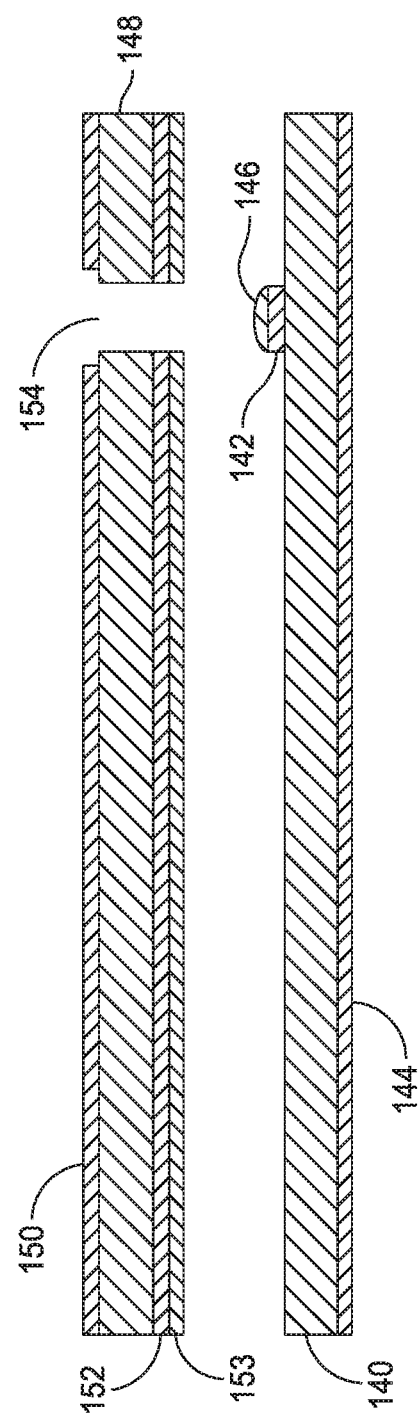

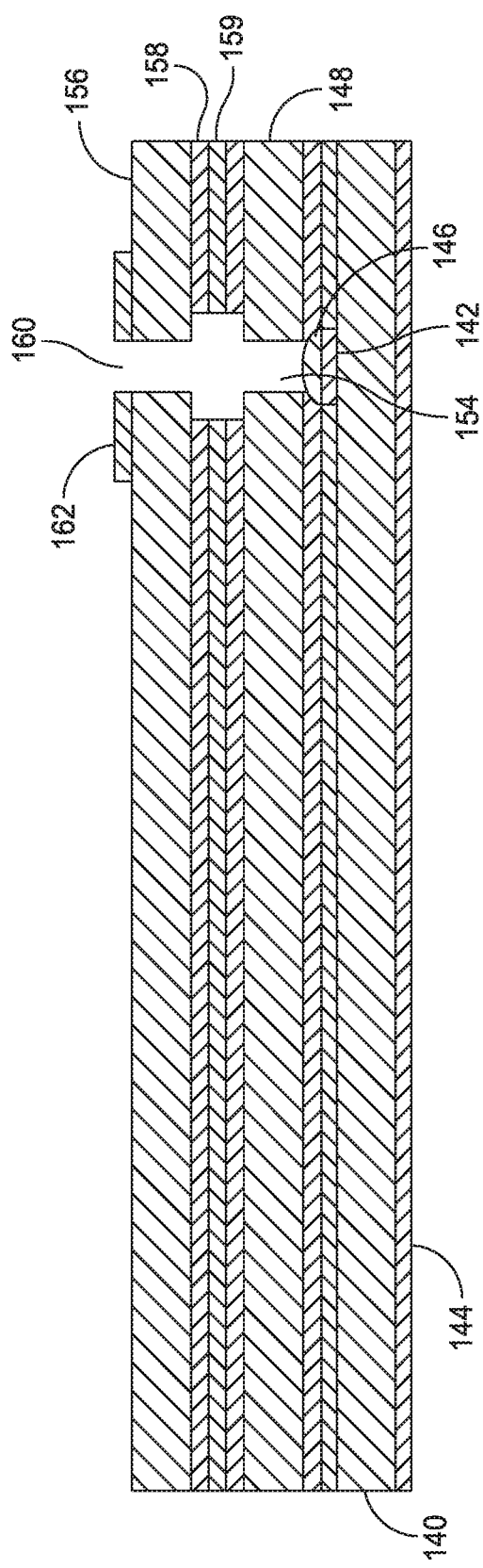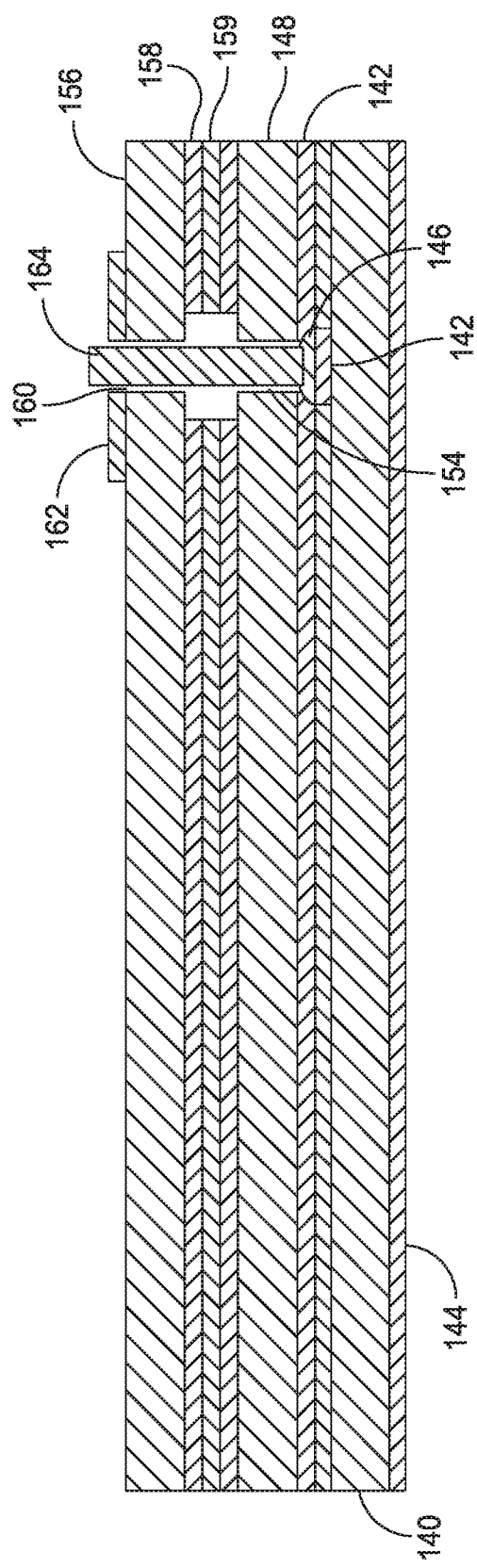

ADDITIVE MANUFACTURING TECHNOLOGY (AMT) INVERTED PAD INTERFACE

GOVERNMENT RIGHTS

Not applicable.

BACKGROUND

Radio frequency (RF) and electromagnetic circuits may be manufactured using conventional printed circuit board (PCB) processes. Conventional PCB manufacturing processes may include lamination, electroplating, masking, etching, and other complex process steps, and may require multiple steps, expensive and/or hazardous materials, multiple iterations, extensive labor, etc., all leading to higher cost and slower turnaround time. Currently, conventional PCB manufacturing processes employ electroplated vias to connect traces between layers on the printed circuit board. Specifically, to connect signal paths from one conductive layer of the printed circuit board to another conductive layer of the board, holes or through holes are drilled through the board and are subsequently coated or plated with a conductive substance, such as copper.

FIG. 1 illustrates an electronic substrate 10 having a dielectric layer 12 disposed between two copper layers 14, 16. An electroplated via 18 is disposed within the substrate and configured to connect to a trace 20. In one embodiment, the electroplated via 18 and the trace 20 are fabricated from plated copper. Other processes used to connect traces between layers on the board. For example, U.S. Pat. No. 6,747,217 discloses the use of a conductive gold-plated post that is driven through a hole formed in a board into the traces below. Instead of coating or plating, a via is formed by placing a conductive stake or post in the through-hole. The post is slightly larger than the hole, and must be forced through the conductive trace.

SUMMARY

One aspect of the present disclosure is directed to a multilayer printed circuit board including a first dielectric layer and a second dielectric layer. The first dielectric layer has a top surface and a bottom surface. The second dielectric layer has a top surface and a bottom surface. The first dielectric layer is positioned above the second dielectric layer with the bottom surface of the first dielectric layer facing the top surface of the second dielectric layer. The top surface of the second dielectric layer has a conductive trace. The second dielectric layer has a through-hole extending through the conductive trace. The multilayer printed circuit board comprises an inverted pad interface structure including an inverted pad provided on the bottom surface of the first dielectric layer, a first solder layer provided on a surface of the inverted pad, a second solder layer provided on the conductive trace, and a copper wire positioned within the through-hole to provide the vertical and electrical connection with the conductive trace.

Embodiments of the multilayer printer circuit board further may include heating the inverted pad interface structure to a reflow temperature of the first and second solder layers to attach the copper wire to the inverted pad. The multilayer printer circuit board further may include a component mounted on the bottom surface of the second dielectric layer, with the component being connected to the copper wire to provide electrical communication to the component. The first solder layer and the second solder layer each may include a solder alloy to prevent strain induced yielding. The copper wire may be circular in cross-section. The multilayer printed circuit board further may include a vertical copper launch interface structure configured to mount a component on the top surface of the first dielectric layer. The vertical copper launch interface structure may include a through-hole that extends through the first dielectric layer and a second copper wire that is soldered to a conductive trace provided on a top surface of the second dielectric layer.

Another aspect of the disclosure is directed to a process of fabricating an inverted pad interface structure. In one embodiment, the process comprises: forming an inverted pad on a bottom surface of a first dielectric layer; depositing solder on the inverted pad in the form of a solder bump; providing the conductive trace on the top surface of the second dielectric layer and depositing solder or solder paste on the conductive trace; forming a through-hole in the second dielectric layer; inserting copper wire in a through-hole provided in the second dielectric layer; and applying heat and/or pressure to the laminated package to assemble and create the inverted pad interface structure.

Embodiments of the process further may include aligning the through-hole with the conductive trace. The process further may include mounting a component on a bottom surface of the second dielectric layer, the component being connected to the copper wire to provide electrical communication to the component. Applying heat may include heating the inverted pad interface structure to a reflow temperature to attach the copper wire to the inverted pad. The solder may include a solder alloy to prevent strain induced yielding.

Yet another aspect of the disclosure is directed to a multilayer printed circuit board including a bottom dielectric layer, a middle dielectric layer, and a top dielectric layer. Each dielectric layer has a top surface and a bottom surface. The bottom dielectric layer is positioned below the middle dielectric layer with the top surface of the bottom dielectric layer facing the bottom surface of the middle dielectric layer. The middle dielectric layer is positioned below the top dielectric layer with the top surface of the middle dielectric layer facing the bottom surface of the top dielectric layer. The top surface of the bottom dielectric layer has a conductive trace, with the middle dielectric layer and the top dielectric layer each having a through-hole aligned with one another that extends to the conductive trace. The multilayer printed circuit board comprises an interface structure including a solder bump deposited on the conductive trace. The solder bump is accessible through the aligned through-holes. The multilayer printed circuit board further comprises a copper wire positioned within the aligned through-holes to provide the vertical and electrical connection with the conductive trace, and a conductive pad provided on the top surface of the top dielectric layer.

Embodiments of the multilayer printed circuit board further may include heating the interface structure to a reflow temperature of the solder bump to attach the copper wire to the inverted pad. The multilayer printed circuit board further may include a component mounted on the conductive pad, with the component being connected to the copper wire to provide electrical communication to the component. The solder bump may include a solder alloy to prevent strain induced yielding.

Another aspect of the disclosure is directed to a process of fabricating an interface structure. In one embodiment, the process comprises: providing a bottom dielectric layer having a signal trace; depositing a solder bump on the signal trace; positioning a middle dielectric layer above the bottom dielectric layer; creating a through-hole through the middle dielectric layer to allow room for the solder bump of the bottom dielectric layer to reflow in the through-hole; positioning a top dielectric layer above the middle dielectric layer; creating a through-hole through the top dielectric layer, the through-hole of the top dielectric layer and the through-hole of the middle dielectric layer being aligned with one another to enable access to the solder bump; inserting copper wire into the aligned through-holes of the top dielectric layer and the middle dielectric layer until the copper wire touches the solder bump; and heating the solder bump to a reflow temperature to secure the copper wire to the signal trace.

Embodiments of the process further may include drilling into the aligned through-holes to remove bond film which may have flowed into the aligned through-holes. The copper wire may be 5 mils in diameter. The process further may include creating a pad to the top dielectric layer that surrounds the through-hole of the top dielectric layer.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures may be represented by a like numeral. For purposes of clarity, not every component may be labeled in every figure. In the figures:

FIGS. 9-12 are cross-sectional views of process steps used to fabricate a vertical trace of an embodiment of the present disclosure.

DETAILED DESCRIPTION

Embodiments of the present disclosure are directed to an inverted pad fabrication method and structure that is employed to create a bottom solder joint of a copper vertical launch (CVL) interface when the wire must approach the bottom from the opposite side of a conductive trace. This CVL interface is configured to enable accessing a signal trace from either side of the transmission line without using edge contact. Edge contact between the copper wire and the microwave trace decreases the mechanical resilience of the interface. The inverted pad interface structure ensures a strong solder connection at the base of the CVL, and enables blind interconnections in PCB manufacturing.

The inverted pad interface structure further enables access to either side of a microwave transmission line for a CVL interface. The structure further enables rapid prototyping time and the development of a high yield process without a need for panel coupons that are typically used in conventional manufacturing processes. The structure further allows the CVL to enter or leave a microwave trace from the opposite side and allows use between internal board layers, not only with connections between one inner and one outer layer. Solder is used to pre-tin the inverted pad before bonding. The solder is later reflowed connecting the inverted pad to the conductive trace layer and copper wire.

Figure 1:
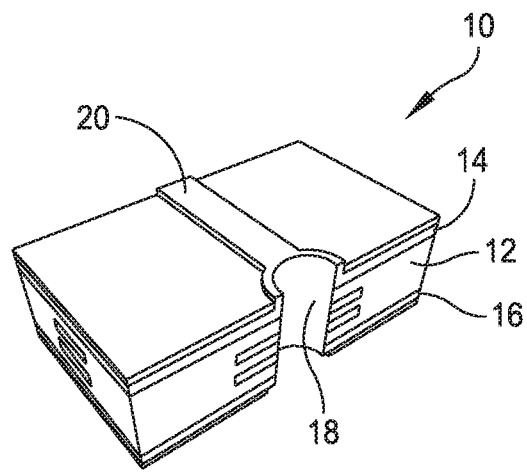
FIG. 1 is a perspective view of an electronic substrate having a vertical trace constructed in accordance with a known process.
Figure 2:
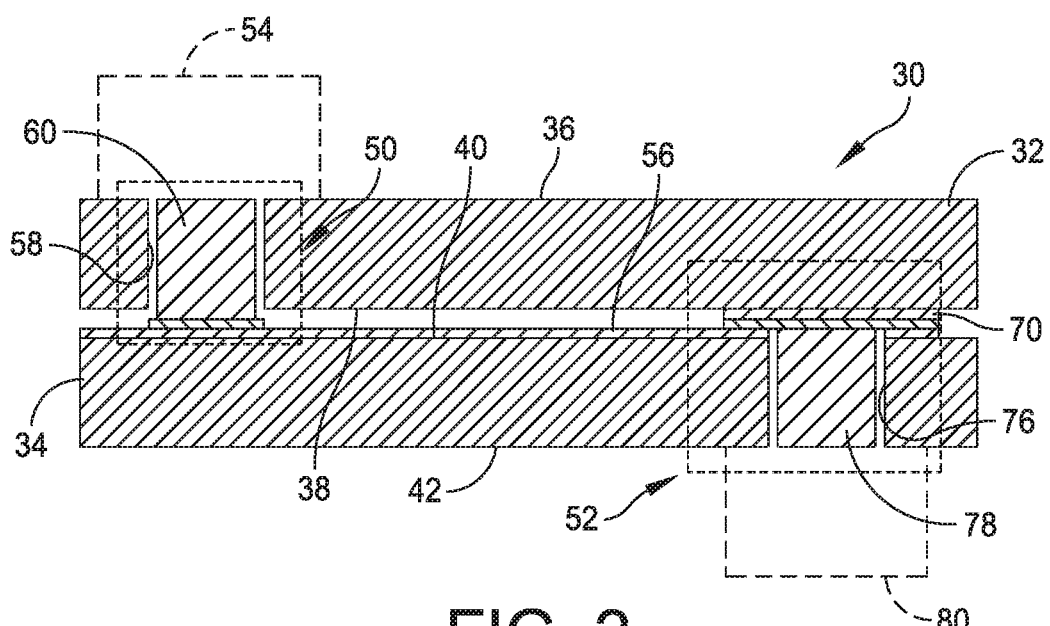
FIG. 2 is a cross-sectional view of an electronic substrate having a vertical trace constructed in accordance with embodiments of the present disclosure.

Referring to FIG. 2, a portion of a printed circuit board is generally indicated at 30. As shown, the printed circuit board 30, which is sometimes broadly referred to herein as an electronic substrate, includes two dielectric layers, indicated at 32, 34. The first or upper dielectric layer 32 includes a top surface 36 and a bottom surface 38. Similarly, the second or lower dielectric layer 34 includes a top surface 40 and a bottom surface 42. The dielectric layers 32, 34 are stacked on top of one another with the bottom surface 38 of the first dielectric layer 32 facing the top surface 40 of the second dielectric layer 34.

A multilayer printed circuit board has conductive trace layers (horizontal and vertical) inside the printed circuit board. This is achieved by laminating a stack of materials in a press by applying pressure and heat to the stack of materials, resulting in a multilayer printed circuit board. In one embodiment, a four-layer printed circuit board can be fabricated from a two-sided copper-clad laminate, having circuitry on both sides of the laminate, which is laminated to the top and bottom pre-preg layer and copper foil. The laminate stack is drilled, plated and etched provide conductive traces on top and bottom layers. Holes are drilled through the printed circuit board. As mentioned above, traditional methods involve making the holes conductive by electroplating or inserting hollow metal eyelets, to connect board layers. Vertical launches can be created by staking copper wire into the holes. In some known embodiments, leads of through-hole components are inserted into the holes and soldered by a wave soldering process, for example. Vertical interconnects or vias also provide an electrical connection between layers in a physical electronic circuit that extends through the plane of one or more adjacent layers. When very small vias are required, the vias may be created by a process other than drilling, such as laser or plasma drilling.

FIG. 2 illustrates the printed circuit board 30 having a traditional interface structure generally indicated at 50 and an inverted pad interface structure indicated at 52 of an embodiment of the present disclosure. The traditional interface structure 50 is configured to connect, for example, a component 54 mounted on the top surface 36 of the first dielectric layer 32 to a conductive trace 56 provided on the top surface 40 of the second dielectric layer 34. The traditional interface structure 50 includes a through-hole 58 that extends through the first dielectric layer 32 and a copper wire 60 that is soldered to the conductive trace 56 provided on the top surface 40 of the second dielectric layer 34. As mentioned, the traditional interface structure 50 provides an electrical connection between a conductive trace or component, e.g., component 54, provided on the top surface 36 of the first dielectric layer 32 and the conductive trace 56 provided on the top surface 40 of the second dielectric layer 34. The known methods described herein can be used to fabricate the traditional CVL interface structure.

Figure 3:
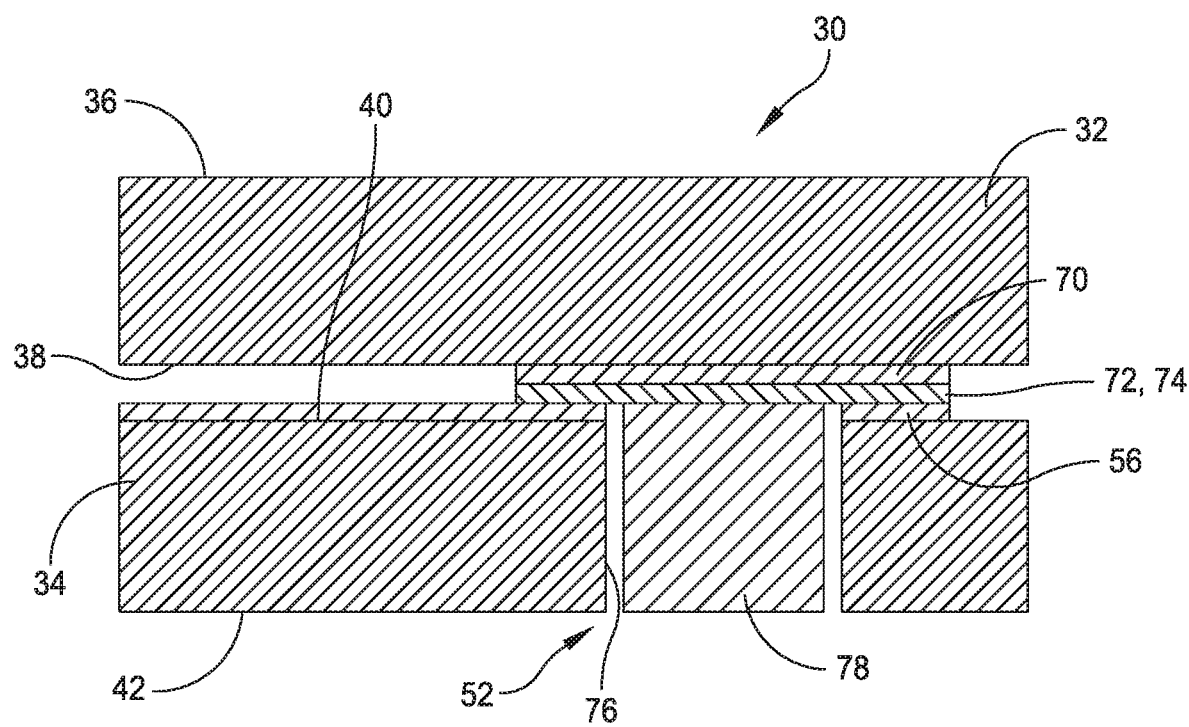
FIG. 3 is an enlarged cross-sectional view of the electronic substrate shown in FIG. 2 showing the vertical trace.

Referring to FIG. 3, the inverted pad interface structure 52 is designed to enable CVL connections from a different direction, e.g., from under the second dielectric layer 34. In the shown embodiment, the inverted pad interface structure 52 includes an inverted pad 70 provided on the bottom surface 38 of the first dielectric layer 32. In one embodiment, the inverted pad 70 is fabricated from copper material, which is formed on the bottom surface 38 of the first dielectric layer 32 by any of the processes described herein. For example, the inverted pad 70 can be fabricated by etching a copper layer applied to the bottom surface 38 of the first dielectric layer 32. The inverted pad 70 is located over the conductive trace 56 provided on the top surface 40 of the second dielectric layer 34. The inverted pad interface structure 52 includes a solder layer 72 of solder or solder paste provided on a surface of the inverted pad 70. For example, solder layer 72 can be applied manually or automatically by a known process, such as by a stencil print process or by a dispensing process on the surface of the inverted pad. In one embodiment, the solder layer 72 includes a solder alloy to prevent strain induced yielding. In one embodiment, the solder alloy is a high-temperature alloy, which exceeds the operation temperature of most printed circuit board lamination processes. Selecting a solder material with a melt temperature above the printed circuit board lamination temperature enables the manufacturer to maintain the integrity of the solder layer throughout the process. Depending on the printed circuit board lamination temperature condition, other solder materials can be used as an appropriate substitute, e.g., 60/40 Sn/Pb, 63/37 Sn/Pb or SAC 305.

The inverted pad interface structure 52 further includes the conductive trace 56 provided on the top surface 40 of the second dielectric layer 34 as mentioned above. The conductive trace 56 is fabricated from copper material, which is formed on the top surface 40 of the dielectric layer 34 by any of the processes described herein. The conductive trace 56 also includes a solder layer 74 of solder or solder paste provided on a surface of the conductive trace. As shown, the second dielectric layer 34 includes a through-hole 76 formed therein that extends through the conductive trace 56. The through-hole 76 can be fabricated by any known process, such as by drilling. Other processes can be employed, such as laser drilling. The size of the through-hole 76 can be selected based on design criteria. The inverted pad interface structure 52 further includes a copper wire 78 positioned within the through-hole 76 to provide the vertical and electrical connection with the conductive trace 56. In one embodiment, the copper wire 78 is sized to press fit into the through-hole 76. The copper wire 78 provides electrical communication between the conductive trace 56 and a component, such as component 80, mounted on the bottom surface 42 of the second dielectric layer 34, for example. The inverted pad interface structure 52 can be configured to connect the conductive trace 56 or some other component associated with the first dielectric layer 32 with a component or conductive trace associated with the second dielectric layer 34.

Once assembled, the multilayer printed circuit board 30 is heated to reflow the solder layers, including solder layers 72, 74, thereby creating the traditional and inverted pad interface structures 50, 52. In one known process, the multilayer printed circuit board 30 is passed through a reflow oven set at a temperature to enable reflow of the solder layers thereby connecting the copper wire 60 to the conductive trace 56 of the traditional interface structure 50 and the copper wire 78 to the inverted pad 70 and the conductive trace 56 of the inverted pad interface structure 52. As shown in FIG. 2, a component 80 can be mounted on the bottom surface 42 of the second dielectric layer 34. In another embodiment, pressure can also be applied to create the structures 50, 52. The resulting CVL interface and inverted pad interface structures 50, 52 enable vertical communication between conductive traces and components mounted on the top surface 36 of the first dielectric layer 32 and the bottom surface 42 of the second dielectric layer 34.

Figure 4:
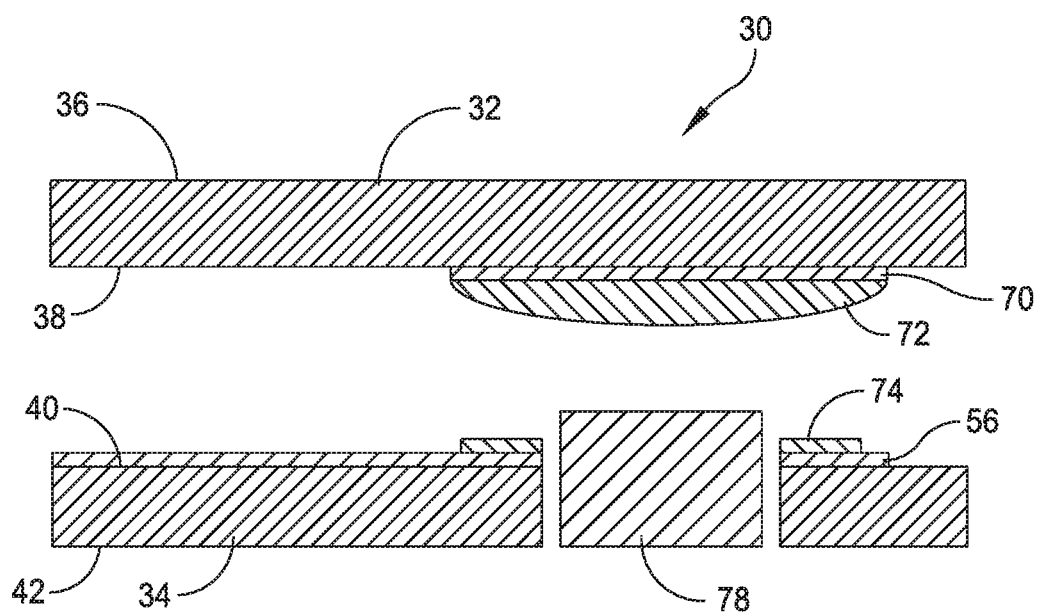
FIG. 4 is a cross-sectional view of the electronic substrate shown in FIGS. 2 and 3 during the fabrication of the vertical trace.

Referring to FIG. 4, a process to fabricating the inverted pad interface structure 52 includes providing the inverted pad 70 on the bottom surface 38 of the first dielectric layer 32. The process further includes depositing a solder layer 72 of solder or solder paste on the inverted pad 70 in the form of a solder bump. The solder bump should be small enough such that it does not inhibit the printed circuit board lamination process, yet large enough to create a good mechanical connection to the CVL wire and adjacent conductive trace when subjected to a reflow temperature. The solder bump can have a height of 0.002 to 0.005 inch while being held in the shape of a bump by surface tension of the solder. The process further includes providing the conductive trace 56 on the top surface 40 of the second dielectric layer 34 and depositing solder layer 74 of solder or solder paste on the conductive trace. The process further includes forming a through-hole 76 in the second dielectric layer 34 and inserting a copper wire 80 in the through-hole. The through-hole 76 can be aligned with or otherwise formed in the conductive trace 56.

The process further includes applying heat (and/or pressure) to the laminated package to assemble and create the inverted pad interface structure 52. The creation of the inverted pad interface structure 52 enables CVL connections to depart a microwave trace layer from a different direction than they arrived. The process is a chemical-free, dry process with less process steps than conventional processes used to fabricate conventional CVLs. This leads to significantly reduced costs when compared to prior processes.

In some embodiments, using center conductors in conjunction with additive manufacturing technology (AMT) Faraday Walls to create vertical coaxial interfaces provides excellent isolation in CVL connections.

In some embodiments, the coaxial interface can be sized (center conductor diameter, outer conductor diameter) to match the transmission lines its connecting. This results in very low reflection coefficients.

In some embodiments, the inverted pad interface structure does not significantly affect the electrical response of the interface and provides wide bandwidth performance.

In some embodiments, as mentioned above, the inverted pad interface structure provides a low-cost and less-process intensive way to exit a microwave trace layer in a different direction than it was entered.

In some embodiments, the process can include minimal touch labor, utilizing high-precision machines that can be automated.

In some embodiments, the solder is configured to reflow at 227° C. so that the solder can be used during lamination without risk of reflow.

Figure 5:
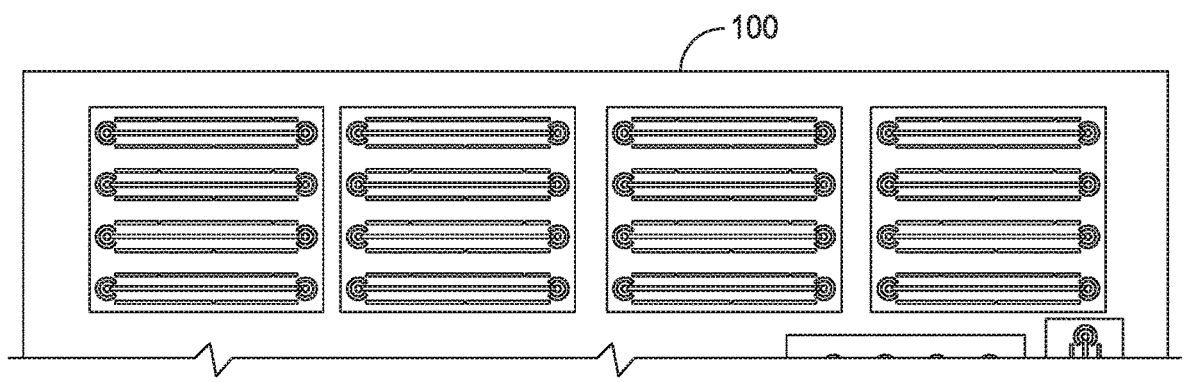
FIG. 5 is a plan view of a test board used to test electronic substrates.

Referring to FIG. 5, a test board, such as test board 100, can be employed to test circuit designs. As shown, the test board is configured to support four circuit designs.

Figure 6:
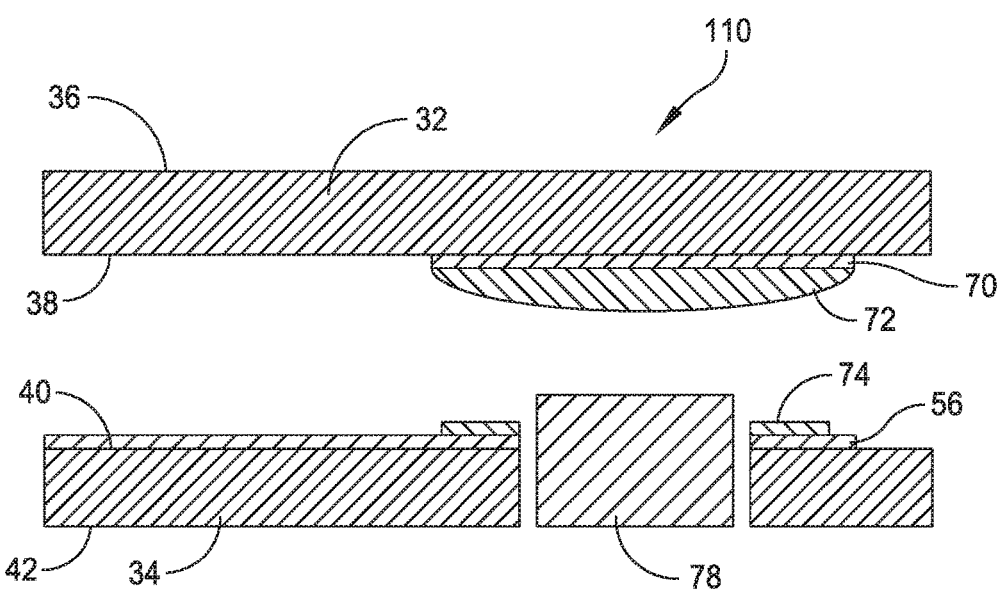
FIGS. 6-8 are cross-sectional views of embodiments of electronic substrates during fabrication of the vertical traces.
Figure 7:
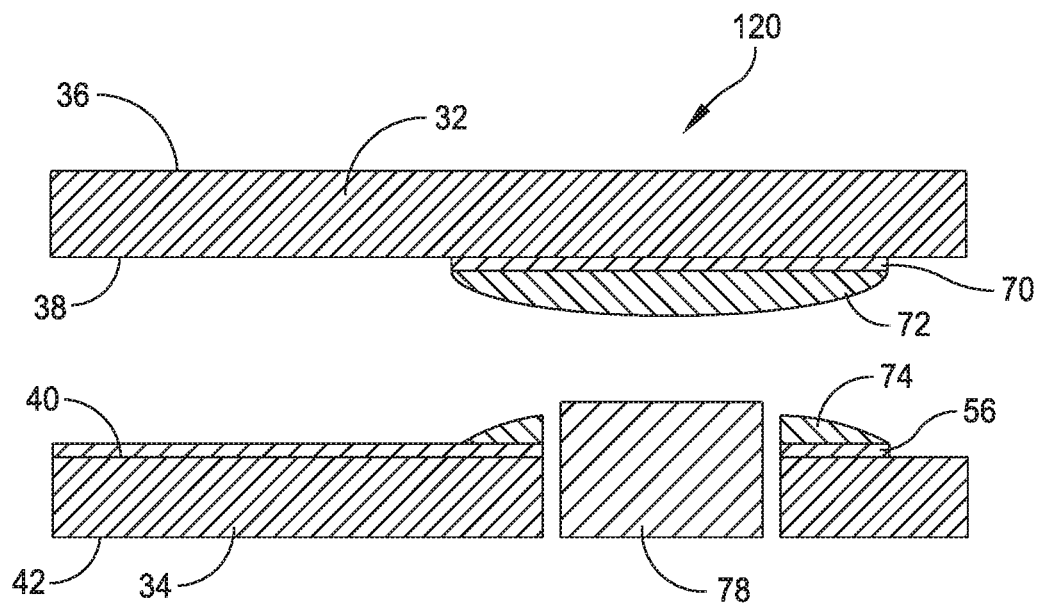
Figure 8:
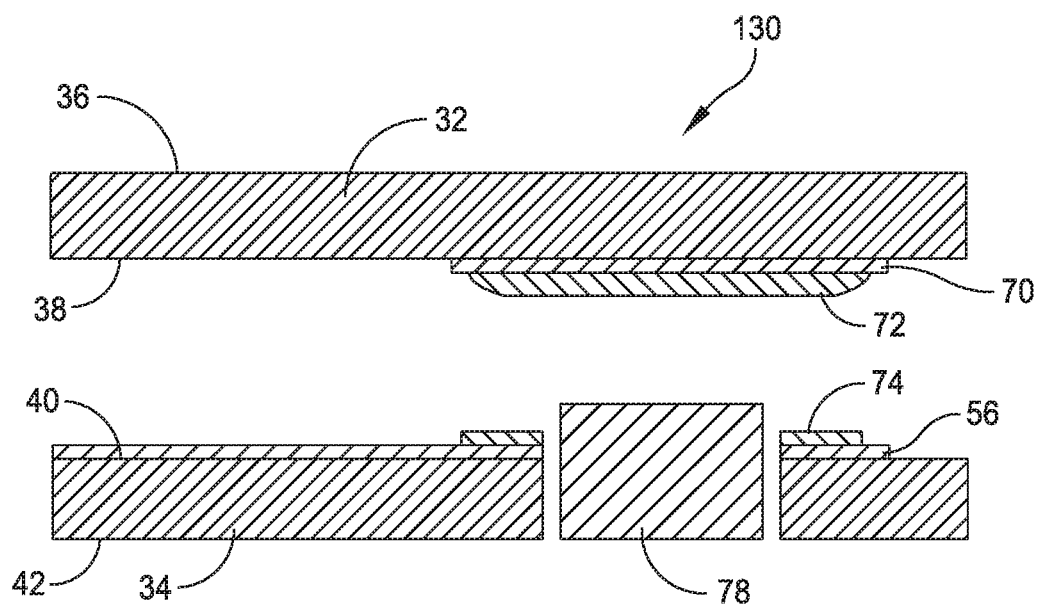

Referring to FIGS. 6-8, the inverted pad interface structure can include several designs that are similar to the inverted pad interface structure 52 illustrated in FIGS. 2-4.

For example, as shown in FIG. 6, an inverted pad interface structure 110 includes a 227° C. solder bump 72 applied to the inverted pad 70. In FIG. 7, an inverted pad interface structure 120 includes a 227° C. solder bump 72, which is applied to the inverted pad 70, and a 227° C. solder bump 74, which is applied to the conductive trace 56. In FIG. 8, an inverted pad interface structure 130 includes a 227° C. solder flat layer 72, which is applied to the inverted pad 70, and a 227° C. solder flat layer 74, which is applied to the conductive trace 56.

In one embodiment, the process of fabricating an interface structure in a multilayer printed circuit board having three dielectric layers is represented sequentially in FIGS. 9-13. As shown, a bottom dielectric layer 140 has an inverted pad 142 and a ground plane 144. The process includes depositing a pre-tin solder bump or dome 146 on the inverted pad 142, which in one embodiment is milled out of the double cladded bottom dielectric layer 140. This is illustrated in FIG. 9.

The process further provides a middle dielectric layer 148 having a ground plane 150, a feed signal or signal trace 152, and bond film 153. The process includes creating a pre-cut hole 154, e.g., by drilling, in the middle dielectric layer 148 to allow room for the solder bump 146 of the bottom dielectric layer 140 during bonding and for CVL implementation after bonding. The hole 154 of the middle dielectric layer 148 is positioned over the solder bump 146 of the bottom dielectric layer 140. The hole 154 of can be enlarged at the ground plane layer 150 as not to inadvertently short the trace layers to ground during CVL implementation. This is illustrated in FIG. 10.

The process further includes providing a top dielectric layer 156 having a ground plane 158 and a bond film 159 disposed above the middle dielectric layer 148. The process includes creating a pre-cut cavity 160 through the top dielectric layer 156, the ground plane 158, and the bond film 159. The top dielectric layer 156 is positioned on top of the middle dielectric layer 148 so that the pre-cut cavity 160 of the top dielectric layer 156 is aligned with the pre-cut cavity 154 of the middle dielectric layer 148. A pad 162 is created by a process described herein to the top dielectric layer 156 that surrounds the pre-cut cavity 160. This is illustrated in FIG. 11.

The process further may include drilling into the pre-formed hole created by pre-cut hole 154 and pre-cut hole 160 to remove bond film 153, which may have flowed into the area. After drilling to solder bump 146, a cylinder of copper 164, e.g., copper wire, is inserted in the aligned pre-cut cavities 154, 160 until the wire touches the solder bump down below. The copper cylinder 164 can be as small as 5 mils in diameter, which is much smaller than the convention process can create. This is illustrated in FIG. 12.

Once assembled, the assembly is heated to a reflow temperature of the solder forming the solder bump 146 to secure the copper cylinder 164 to the inverted pad 142. An electronic component can be mounted on the pad 162.

In certain embodiments, a printed circuit board (PCB) includes signal paths on different conductive layers. The signal paths are electrically coupled together by vias. A multilayer PCB also includes a double layer board. The term "conductive layer" refers to a trace of conductive material placed upon an insulating layer for providing a pathway for an electrical signal.

In one embodiment, the wire is fabricated from copper. However, other materials can be used, such as a phosphor bronze material having sides that are gold-over-nickel plated. Such materials are well known. Similarly, the wire can be manufactured using known techniques.

Illustratively, the shape of the wire is cylindrical; however, other shapes can be used, e.g., square, or rectangle. As shown, the diameter of the wire conductive stake should approximate, or be slightly larger than, the diameter of the hole to ensure mechanical stability and provide an electrical interconnect. The length of the wire is selected as a function of the number of conductive layers that need to be coupled together.

Although the inventive concept was described in the context of a particular type of wire, other types of pins or wires can be used. Also, although a rigid multilayer board is described herein, other types of boards can be used, such as flexible boards. The wire can be mechanically fastened differently than described above, e.g., like a rivet, to ensure mechanical fastening. Similarly, although the wire is secured by inserting the wire into the via using a "press fit" for connecting the wire to the conductive layers, other types of connection methods may be used. For example, the wire could initially have a smaller diameter than the through-hole such that upon heating the wire expands to fill the hole.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and methods or their components to any one positional or spatial orientation.

The term "radio frequency" as used herein is not intended to be limited to a particular frequency, range of frequencies, band, spectrum, etc., unless explicitly stated and/or specifically indicated by context. Similarly, the terms "radio frequency signal" and "electromagnetic signal" are used interchangeably and may refer to a signal of various suitable frequency for the propagation of information-carrying signals, for any particular implementation. Such radio frequency signals may generally be bound at the low end by frequencies in the kilohertz (kHz) range, and bound at the high end by frequencies of up to hundreds of gigahertz (GHz), and explicitly includes signals in the microwave or millimeter wave ranges. Generally, systems and methods in accord with those described herein may be suitable for handling non-ionizing radiation, at frequencies below those conventionally handled in the field of optics, e.g., of lower frequency than, e.g., infrared signals.

Various embodiments of radio frequency circuits may be designed with dimensions selected and/or nominally manufactured to operate at various frequencies. The selection of appropriate dimensions may be had from general electromagnetic principles and are not presented in detail herein.

The methods and apparatuses described herein may support smaller arrangements and dimensions than conventional processes are capable. Conventional circuit boards may be limited to frequencies below about 30 GHz. The methods and apparatuses described herein may allow or accommodate the manufacture of electromagnetic circuits of smaller dimensions, suitable for radio frequency circuits intended to be operated at higher frequencies, using safer and less complex manufacturing, at lower cost.

Electromagnetic circuits and methods of manufacture in accord with those described herein include various additive and subtractive manufacturing techniques to produce electromagnetic circuits and components capable of handling higher frequencies, with lower profiles, and at reduced costs, cycle times, and design risks, than conventional circuits and methods. Examples of techniques include machining (e.g., milling) of conductive material from a surface of a substrate to form transmission wave phased arrays, which may be of significantly smaller dimensions than allowed by conventional PCB processes, machining of one or more substrates to form a trench, using 3-dimensional printing techniques to deposit printed conductive inks into the trench to form a continuous electric barrier (e.g., a Faraday wall) (as opposed to a series of ground vias with minimum spacing therebetween), "vertical launch" signal paths formed by machining (such as milling, drilling, or punching) a hole through a portion of substrate and in which a conductor (such as a wire segment) is placed and/or conductive ink is printed, to make electrical contact to a transmission line disposed on a surface of the substrate (or an opposing substrate), and using 3-dimensional printing techniques to deposit printed resistive inks to form resistive components.

Any of the above example techniques and/or others (e.g., soldering and/or solder reflow), may be combined to make various electromagnetic components and/or circuits. Aspects and examples of such techniques are described and illustrated herein with respect to a wave phased array to contain and convey an electromagnetic signal along a layer of an electromagnetic circuit in one dimension and, optionally, vertically through to other layers of the circuit in another dimension. The techniques described herein may be used to form various electromagnetic components, connectors, circuits, assemblies, and systems.

As used herein, AMT refers to manufacturing processes, equipment and materials that are used to produce objects. For example, AMT can include 3D printing processes that are used to produce three-dimensional objects. Other processes can be implemented, such as jetting, fusion, extrusion, deposition and lamination processes. Factors determining which process to pursue include, but are not limited to speed of production, costs, use of material and geometric limitations.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only.

What is claimed is:

1. A multilayer printed circuit board including a first dielectric layer and a second dielectric layer, the first dielectric layer having a top surface and a bottom surface, the second dielectric layer having a top surface and a bottom surface, the first dielectric layer being positioned above the second dielectric layer with the bottom surface of the first dielectric layer facing the top surface of the second dielectric layer, the top surface of the second dielectric layer having a conductive trace, the second dielectric layer having a through-hole extending through the conductive trace, the multilayer printed circuit board comprising: an inverted pad interface structure including an inverted pad provided on the bottom surface of the first dielectric layer, a first solder layer provided on a surface of the inverted pad, a second solder layer provided on the conductive trace, and a copper wire positioned within the through-hole to provide the vertical and electrical connection with the conductive trace, the copper wire contacts the first solder layer and the second solder layer.

2. The multilayer printed circuit board of claim 1, wherein the inverted pad interface structure is heated to a reflow temperature of the first and second solder layers to attach the copper wire to the inverted pad.

3. The multilayer printed circuit board of claim 1, further comprising a component mounted on the bottom surface of the second dielectric layer, the component being connected to the copper wire to provide electrical communication to the component.

4. The multilayer printed circuit board of claim 1, wherein the first solder layer and the second solder layer each includes a solder alloy to prevent strain induced yielding.

5. The multilayer printed circuit board of claim 1, wherein the copper wire is circular in cross-section.

6. The multilayer printed circuit board of claim 1, further comprising a vertical copper launch interface structure configured to mount a component on the top surface of the first dielectric layer.

7. The multilayer printed circuit board of claim 6, wherein the vertical copper launch interface structure includes a through-hole that extends through the first dielectric layer and a second copper wire that is soldered to a conductive trace provided on a top surface of the second dielectric layer.

8. A process of fabricating an inverted pad interface structure, the process comprising: forming an inverted pad on a bottom surface of a first dielectric layer; depositing solder on the inverted pad in the form of a solder bump; providing the conductive trace on the top surface of the second dielectric layer and depositing solder or solder paste on the conductive trace; forming a through-hole in the second dielectric layer; inserting copper wire in a through-hole provided in the second dielectric layer to provide the vertical and electrical connection with the conductive trace, wherein the through hole extends through the conductive trace and wherein the copper wire contacts the solder or solder paste; and applying heat and/or pressure to the laminated package to assemble and create the inverted pad interface structure.

9. The process of claim 8, wherein the through-hole is aligned with the conductive trace.

10. The process of claim 8, further comprising mounting a component on a bottom surface of the second dielectric layer, the component being connected to the copper wire to provide electrical communication to the component.

11. The process of claim 8, wherein applying heat includes heating the inverted pad interface structure to a reflow temperature to attach the copper wire to the inverted pad.

12. The process of claim 8, wherein the solder includes a solder alloy to prevent strain induced yielding.

13. A multilayer printed circuit board including a bottom dielectric layer, a middle dielectric layer, and a top dielectric layer, each dielectric layer having a top surface and a bottom surface, the bottom dielectric layer being positioned below the middle dielectric layer with the top surface of the bottom dielectric layer facing the bottom surface of the middle dielectric layer, the middle dielectric layer being positioned below the top dielectric layer with the top surface of the middle dielectric layer facing the bottom surface of the top dielectric layer, the top surface of the bottom dielectric layer having a conductive trace, the middle dielectric layer and the top dielectric layer each having a through-hole aligned with one another that extends to the conductive trace, the multilayer printed circuit board comprising: an interface structure including a solder bump deposited on the conductive trace, the solder bump being accessible through the aligned through-holes; a copper wire positioned within the aligned through-holes to provide the vertical and electrical connection with the conductive trace, the copper wire contacts the solder bump, and a conductive pad provided on the top surface of the top dielectric layer.

14. The multilayer printed circuit board of claim 13, wherein the interface structure is heated to a reflow temperature of the solder bump to attach the copper wire to the inverted pad.

15. The multilayer printed circuit board of claim 13, further comprising a component mounted on the conductive pad, the component being connected to the copper wire to provide electrical communication to the component.

16. The multilayer printed circuit board of claim 13, wherein the solder bump includes a solder alloy to prevent strain induced yielding.

17. A process of fabricating an interface structure, the process comprising: providing a bottom dielectric layer having a signal trace; depositing a solder bump on the signal trace; positioning a middle dielectric layer above the bottom dielectric layer; creating a through-hole through the middle dielectric layer to allow room for the solder bump of the bottom dielectric layer to reflow in the through-hole; positioning a top dielectric layer above the middle dielectric layer; creating a through-hole through the top dielectric layer, the through-hole of the top dielectric layer and the through-hole of the middle dielectric layer being aligned with one another to enable access to the solder bump; inserting copper wire into the aligned through-holes of the top dielectric layer and the middle dielectric layer until the copper wire touches the solder bump; and heating the solder bump to a reflow temperature to secure the copper wire to the signal trace; and creating a pad to the top dielectric layer that surrounds the through-hole of the top dielectric layer.

18. The process of claim 17, further comprising drilling into the aligned through-holes to remove bond film which may have flowed into the aligned through-holes.

19. The process of claim 17, wherein the copper wire is 5 mils in diameter.

* * * * *

UNITED STATES PATENT AND TRADEMARK OFFICE
CERTIFICATE OF CORRECTION

PATENT NO. : 10,631,405 B1  
APPLICATION NO. : 16/576895  
DATED : April 21, 2020  
INVENTOR(S) : James E. Benedict et al.

Page 1 of 1

It is certified that error appears in the above-identified patent and that said Letters Patent is hereby corrected as shown below:

In the Claims

Column 10, Claim 1, Line 12, delete "contacts" and insert -- contacting --.

Column 11, Claim 13, Line 15, delete "contacts" and insert -- contacting --.

Column 12, Claim 17, Line 17, delete "and".

Signed and Sealed this
Second Day of June, 2020

Andrei Iancu
*Director of the United States Patent and Trademark Office*